United States Patent [19]

Ogata et al.

[11] Patent Number: 5,428,253
[45] Date of Patent: Jun. 27, 1995

[54] PROXIMITY SWITCH

[75] Inventors: Akimitsu Ogata, Takatsuki; Norio Onji, Kyoto, both of Japan

[73] Assignee: OMRON Corporation, Kyoto, Japan

[21] Appl. No.: 912,860

[22] Filed: Jul. 14, 1992

[30] Foreign Application Priority Data

Jul. 15, 1991 [JP] Japan .................... 3-201378
Jul. 15, 1991 [JP] Japan .................... 3-201379

[51] Int. Cl.6 .................................. G01N 27/00
[52] U.S. Cl. ......................... 307/116; 331/65
[58] Field of Search .............. 331/65; 324/236, 327; 361/180, 203; 307/116

[56] References Cited

U.S. PATENT DOCUMENTS

| | | | |
|---|---|---|---|
| 3,870,948 | 3/1975 | Holt et al. | 331/65 |
| 4,219,740 | 8/1980 | Little | 307/116 |
| 4,521,748 | 6/1985 | Ryczek et al. | 331/108 D |
| 5,025,227 | 6/1991 | Walton | 331/65 |
| 5,034,704 | 7/1991 | Tomioka et al. | 331/65 |

FOREIGN PATENT DOCUMENTS

| | | |
|---|---|---|
| 0171013 | 2/1986 | European Pat. Off. |
| 0227966 | 7/1987 | European Pat. Off. |
| 0250864 | 1/1988 | European Pat. Off. |

Primary Examiner—Steven L. Stephan
Assistant Examiner—Aditya Krishnan
Attorney, Agent, or Firm—Fish & Richardson

[57] ABSTRACT

A high frequency oscillation type proximity switch prevents mutual interference when it is mounted adjacent to other proximity switches. The switch includes a comparator having a threshold value at a level higher than an object detection level of the oscillation output of the proximity switch. When an output is continuously obtained from the comparator, a beat is generated and the generation of mutual interference is detected. Then, the generation is externally displayed, and mutual interference is alarmed and prevented by changing the oscillation frequency.

8 Claims, 6 Drawing Sheets

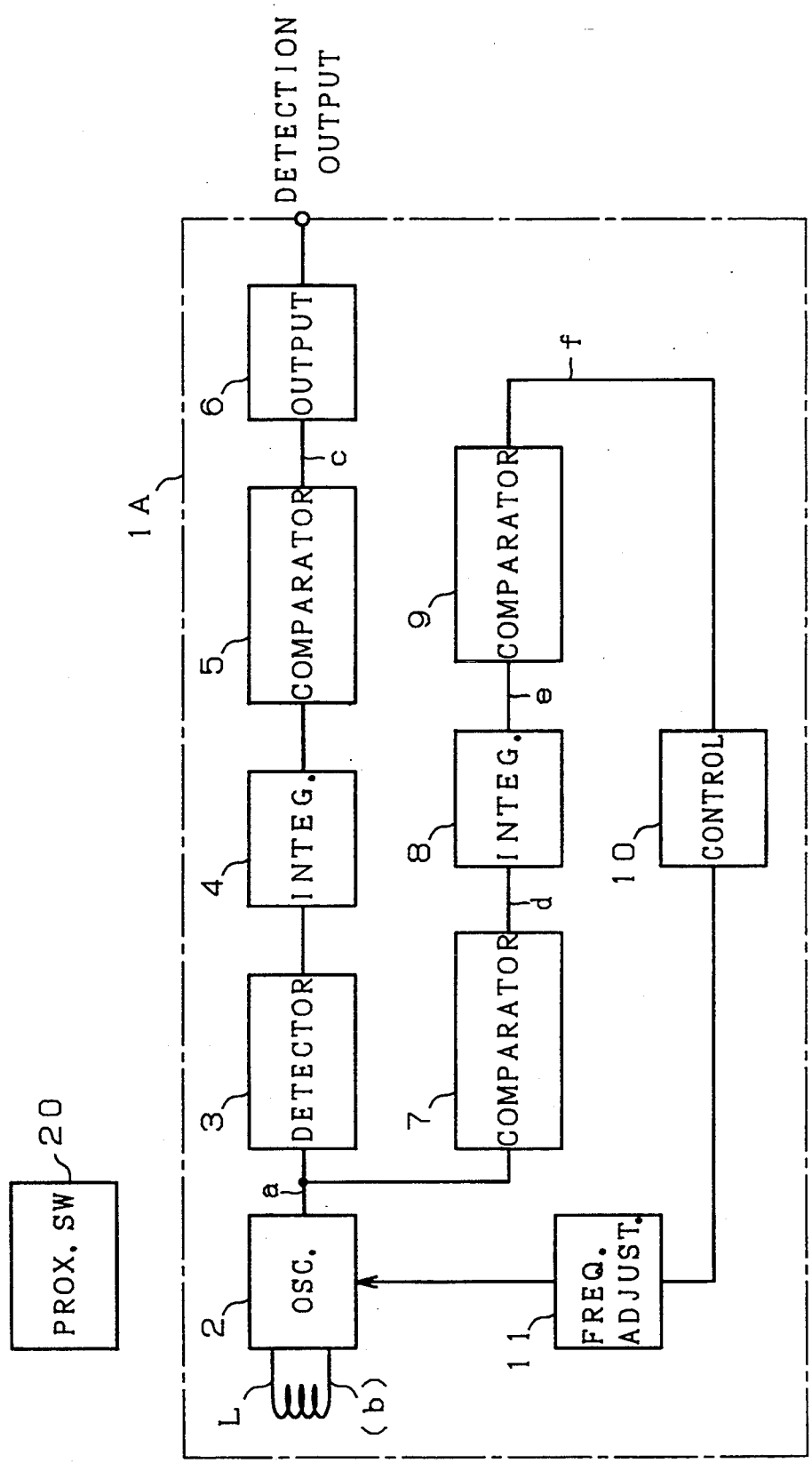

PROXIMITY SWITCH

BACKGROUND OF THE INVENTION

1. Field of the Invention

This invention relates to a proximity switch, and more particularly to a proximity switch having a means for detecting mutual interference when it is arranged in parallel with another proximity switch.

2. Discussion of the Related Art

A conventional high frequency type proximity switch is designed to oscillate at a predetermined high frequency by its oscillator and to decrease its oscillation level when a metal object approaches the proximity switch, whereby an object is detected in response to a change of the oscillation level. When a plurality of such conventional switches are disposed in a parallel relationship, however, a beat phenomenon occurs when the magnetic fields generated by the oscillation coils cross each other so that the proximity switches erroneously detect objects or chattering cause on reversal of signals.

Accordingly, it may be proposed that the respective oscillation frequencies of the proximity switches are designed to be different in order to avoid such mutual interference. There has been proposed a different frequency type proximity switch having a different oscillation frequency to reduce a mutual interference distance. The proposed proximity switch, however, has the disadvantages that a plurality of the proximity switches cannot be closely arranged due to its uneven frequency and reliability against mutual interference cannot be assured when it is mounted within a predetermined distance.

SUMMARY OF THE INVENTION

It is, therefore, an advantage of this invention to provide a proximity switch which detects the generation of mutual interference with other proximity switches and to change the oscillation frequency.

It is another advantage of this invention to provide a proximity switch which detects whether or not any mutual interference is generated and determines a mountable place when it is mounted with other proximity switches.

According to one aspect of this invention, a proximity switch including an oscillator, a first comparison means for detecting a decrease of output level of the oscillator, and a second comparison means for generating an alarm representing a mutual interference when an output from the oscillator exceeds a threshold level which is designed to be higher than an output level when any object does not approach the switch is provided. The proximity switch generates a beat when it is mounted close to other proximity switch and the difference between their oscillation frequencies is small, so that an amplitude of the oscillator is varied from a stationary state by the frequency of the beat. The second comparison means which has a threshold level higher than the stationary state judges whether or not the beat phenomenon is generated in order to generate an alarm of the mutual interference.

According to a further aspect of this invention, a proximity switch which includes an oscillator, a first comparison means for detecting a decrease of output level of the oscillator, a second comparison means for generating an alarm representing a mutual interference when an output from the oscillator exceeds a threshold level which is designed to be higher than an output level when any object does not approach the switch, and a frequency adjusting means for changing the oscillation frequency of the oscillator when a comparison output signal from the second comparison means. The second comparison means which has a threshold level higher than the stationary state judges whether or not a beat phenomenon is generated in order to generate a mutual interference signal. If the mutual interference signal is sensed, the oscillation frequency of the oscillator is changed to avoid any mutual interference.

According to another aspect of this invention, a proximity switch which includes an oscillator, a first comparison means for detecting a decrease of output level of the oscillator, a second comparison means for generating an alarm representing a mutual interference when an output from the oscillator exceeds a threshold level which is designed to be higher than an output level when any object does not approach the switch, and a display means for displaying an output of the second comparison means, and a frequency adjusting means for changing the oscillation frequency of the oscillators is provided. The proximity switch is designed to warn of mutual interference externally so that the oscillation frequency of the oscillator can be adjusted externally.

BRIEF DESCRIPTION OF THE DRAWINGS

The above and other advantages and features of this invention will be more fully understood from the following detailed description provided in conjunction with the following figures.

FIG. 1 is a schematic block diagram of a proximity switch of a first embodiment of this invention;

DETAILED DESCRIPTION OF THE INVENTION

Figure 2A:
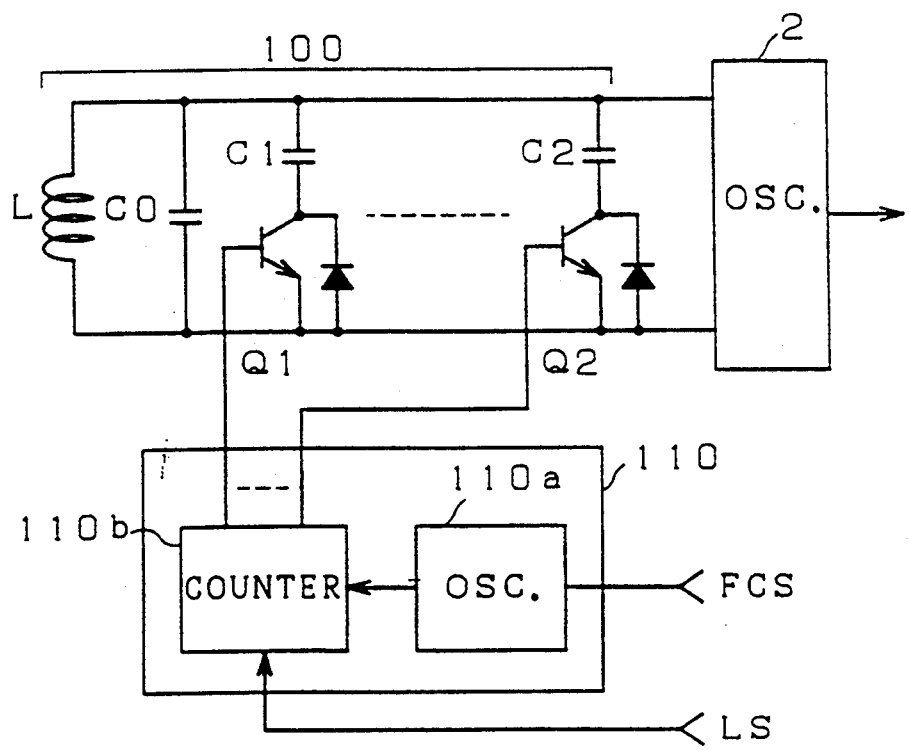
FIGS. 2a and b respectively show different examples of a frequency adjusting circuit which may be employed in the proximity switch of FIG. 1.

Referring, now, to FIG. 1, a schematic block diagram of a proximity switch 1A according to a first embodiment of this invention is shown. The switch 1A includes an oscillator 2 having an oscillation coil L, and a detector 3 detecting an output from the oscillator 2 to be applied to a comparator 5 representing a first comparison means of this embodiment through an integrating circuit 4. The comparator 5 is designed to have a threshold value $V_{ref1}$ corresponding to an integrated output level lower than a stationary output level of the oscillator 2 so as to externally generate an object detection signal through an output circuit 6 when any signal lower than the threshold value is detected, The output of the oscillator 2 is also connected to a comparator 7, The comparator is designed to have a threshold value $V_{ref2}$ at a level higher than a stationary oscillation level of oscillator 2 so as to apply a signal to an integrating circuit 8 when the output of oscillator exceeds the threshold value $V_{ref2}$. The signal is converted to a direct current component by the integrating circuit 8 to be applied to a comparator 9, The comparator 9 is designed to have a predetermined threshold value $V_{ref3}$ so as to generate a signal to inform a control circuit 10 of a mutual interference state when the output from comparator 7 exceeds the threshold value $V_{ref3}$. The comparators 7 and 9 and the integrating circuit 8 provide a second comparison means of this embodiment for detecting a state that an output higher than a stationary oscillation level is obtained, The control circuit 10 includes a random on-delay circuit to provide a switching signal about frequency to a frequency adjusting circuit 11 until the output from the comparator 3 stops, The circuit 11 is disposed to change the oscillation frequency of the oscillator 2, FIGS. 2a and b show block diagrams of different examples of the frequency adjusting circuit 11 and the oscillator 2. In FIG. 2a, the oscillator 2 is connected with a resonance circuit 100 including an oscillation circuit L and a capacitor C0, and further connected in parallel With a plural series connections of capacitor C1 and transistor Q1, and capacitor C2 and transistor Q2. The transistors Q1, are of a switching type, and the respective capacitors C1 ... C2 are connected in series therewith and are adapted to be added to the resonance circuit 100 as a resonance capacitor when the transistors are in the ON state so that the resonance frequency can be changed. A code converting circuit 110 is connected with the bases of transistors Q1, Q2, and includes an oscillator 110a oscillating a clock signal and a binary counter 110b counting the clock signal. Parallel outputs from the counter 110b are applied to bases of transistors Q1, Q2. The oscillator 110a starts to oscillate in response to a frequency control signal FCS. The counter 110b subsequently turns on the transistors Q1, Q2, and stops the oscillation of the clock signal in response to a latch signal LS. Thus, the oscillation frequency of oscillator 2 intermittently varies for a predetermined time.

Figure 2B:
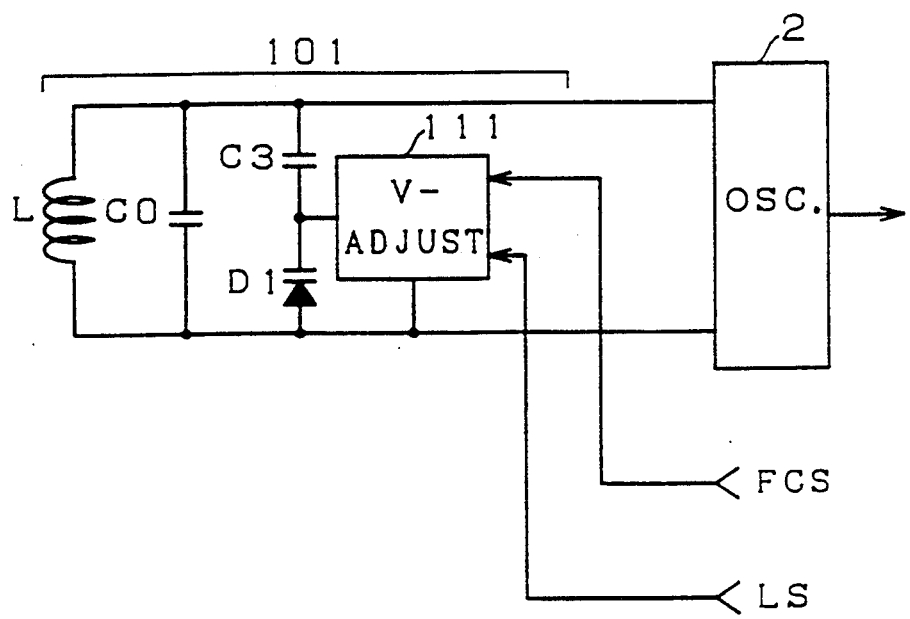

FIG. 2b shows another example of a frequency adjusting circuit 11. A series connection of a capacitor C3 and a variable capacity diode D1 is connected with a coil L and a capacitor C0, which form a resonance circuit 101. The variable capacity diode D1 is connected with a voltage adjusting circuit 111. The circuit 111 is, for example, a saw tooth signal generating circuit which generate a saw tooth signal to gradually increase a terminal voltage of the diode D1 when it receives a control signal FCS from the control circuit 10. If the circuit 111 receives a hold signal in a predetermined time after the output of the comparator 9 stops, it holds the terminal voltage so as to hold a capacitive value of the variable capacity diode D1. Thus, the voltage adjusting circuit 111 continuously changes a direct current voltage applied to the diode D1. Accordingly, the capacity of the diode D1 continuously varies, and the oscillation frequency changes.

In FIGS. 3a–3f a time chart which explains the operation of the proximity switch of this embodiment. The waveforms shown in FIGS. 3a–3f represent the respective wave forms appearing at the corresponding reference marks "a" through "f" in FIG. 1. Unless another proximity switch exists near the proximity switch 1A of FIG. 1, oscillator 2 continues a stationary oscillation between times $t_0$ and $t_1$ as shown in FIG. 3a–3f in which the output from the oscillator 2 is constant unless there exists any object near the switch. Accordingly, comparator 5 does not develop any output, so that any object detection signal is not generated.

Figure 3A:
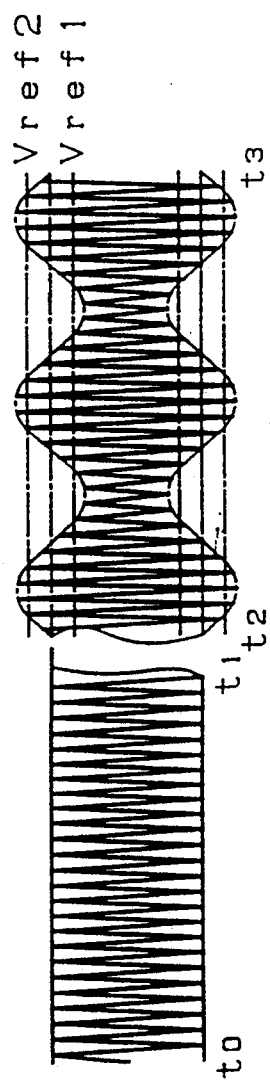
FIGS. 3a–3f is a time chart illustrating operation of the switch of FIG. 1.
Figure 3B:
Figure 3C:
Figure 3D:
Figure 3E:
Figure 3F:

Assuming that another high frequency type proximity switch 20 is adjacent to proximity switch 1A, the oscillation coil L of the switch 1A receives an induced voltage as shown in FIG. 3b and the oscillation amplitude of oscillator 2 varies by the beat phenomenon as shown in the wave after time $t_2$ of FIG. 3a. The varied frequency corresponds to the difference between the frequencies of switches 1A and 20. Since there is a moment where the oscillation amplitude is reduced due to the beat, the output levels obtained from detector 3 and integrating circuit 4 cyclically drop so that erroneous detection signals are generated through comparator 5 as shown in the wave form in FIG. 3c. On the other hand, there are time bands where the amplitudes exceed the threshold value $V_{ref2}$, so that comparator 7 cyclically generates signals as shown in the wave form in FIG. 3d. The signals are integrated by the integrating circuit 8 to produce a signal as shown in the wave form in FIG. 3e. The signal of the wave form shown in FIG. 3e is discriminated by the comparator 9 having threshold value $V_{ref3}$ to provide a signal as shown in the wave form in FIG. 3f to be applied to control circuit 10. The circuit 10 includes an on-delay timer and its output is applied to the frequency adjusting circuit 11, for instance, the code converting circuit 110 of FIG. 2a. Accordingly, a binary output is applied to transistors Q1, Q2 for each cycle so as to subsequently turn on the transistors for changing the oscillation frequency of oscillator 2. If the mutual interference with the adjacent proximity switch ceases and the peak value of output from oscillator 2 becomes lower than the threshold value $V_{ref2}$, comparator 7 stops generating any output and the oscillation frequency is fixed at the switching state. Thus, mutual interference between proximity switches is automatically prevented.

In this embodiment, the control circuit 10 uses a control circuit having a random on-delay timer in order to avoid the risk of continuation of mutual interference between proximity switch 1A and proximity switch 20 which has a construction similar to the switch 1A for changing its frequency if their frequencies are simultaneously changed. In case the variable capacity diode D1 is used to continuously change the oscillation frequency as shown in FIG. 2b, such mutual interference can be avoided as well.

Figure 4:
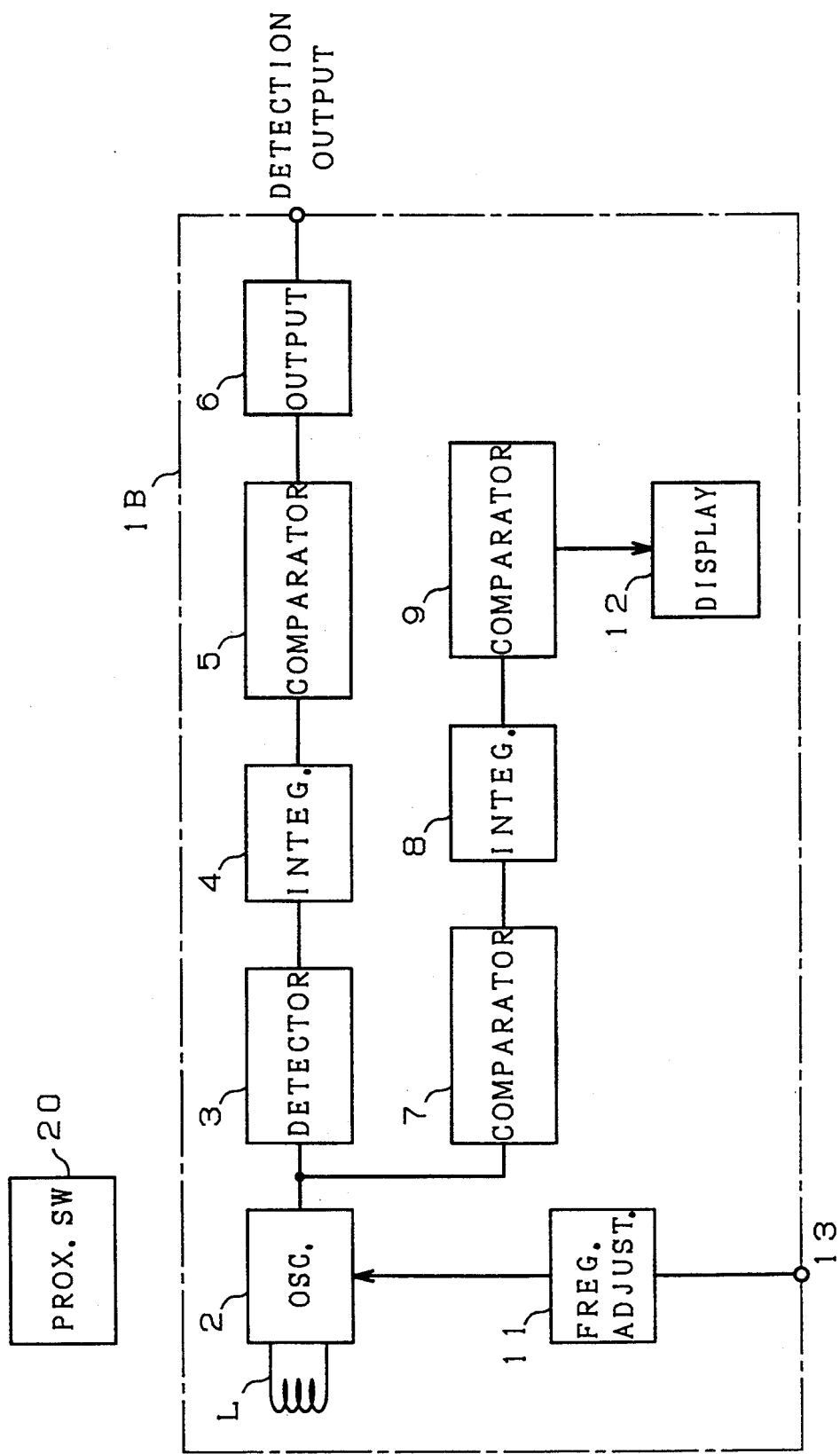
FIG. 4 is a schematic block diagram of a proximity switch of a second embodiment of this invention.

In FIG. 4 a schematic block diagram of a proximity switch 1B as a second embodiment of this invention. The components of this embodiment which are the some as those of switch 1A of the first embodiment are referred to by the same referenced numerals and their detailed explanation is omitted for a simplified explanation. Output of comparator 9 in this embodiment is applied to a display 12 to externally display a mutual interference state. The proximity switch 1B includes an external terminal 13 connected to frequency adjusting circuit 11. The circuit 11 may use the circuit of FIGS. 2a or 2b, or a circuit having a variable capacitor for directly changing the oscillation frequency of oscillator 2. An operator may change to a predetermined frequency by watching the display 12. Thus, a mutual interference can be avoided by changing the oscillation frequency until the display 12 ceases a display.

Figure 5:
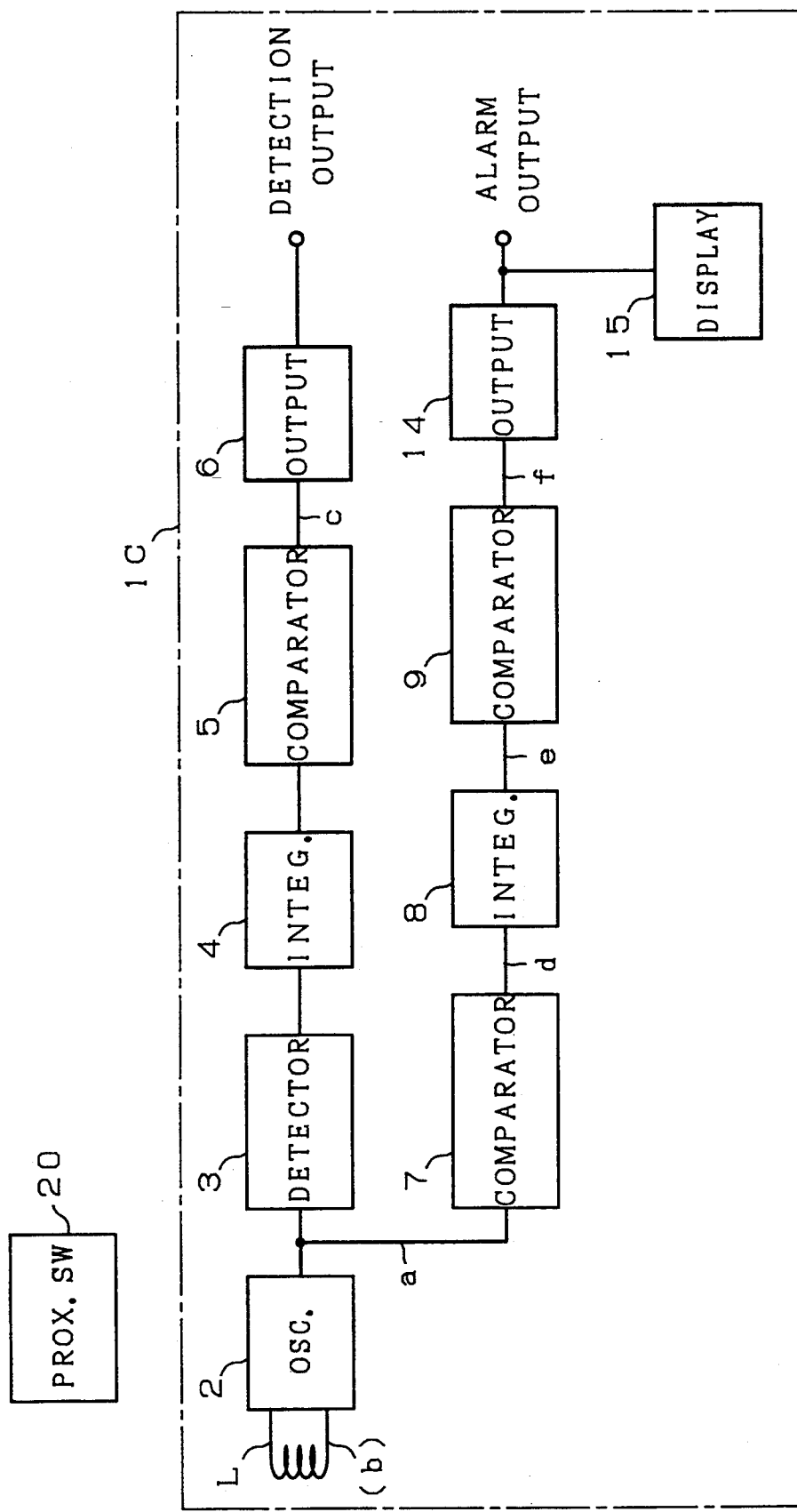
FIG. 5 is a schematic block diagram of a proximity switch of a third embodiment of this invention.

In FIG. 5 a block diagram of a proximity switch 1C as a third embodiment of this invention. The components which the same as those of the first embodiment are referred to by the same reference numerals. Components 2 through 9 are the same as those of FIG. 1. Output of comparator 9 is applied to output circuit 14 to externally generate an alarm signal representing a mutual interference state. A display 15 displays the interference state. If another high frequency oscillation proximity switch approaches, the switch 1C generates a beat state to change oscillation amplitudes as the proximity switch of the first embodiment does. Therefore, if there is a time band where the oscillation amplitudes exceed a threshold value $V_{ref2}$, the comparator 7 generates a cyclic signal in the time band. The cyclic signal is integrated and discriminated by the threshold value $V_{ref3}$ of comparator 9 to generate an alarm signal representing a mutual interference state. The alarm signal is externally generated by output circuit 14 and displayed by display 15. Thus, an operator can select a relative distance to other proximity switch to avoid mutual interference by watching for an indication in display 15 to ensure a safe use.

Figure 6:
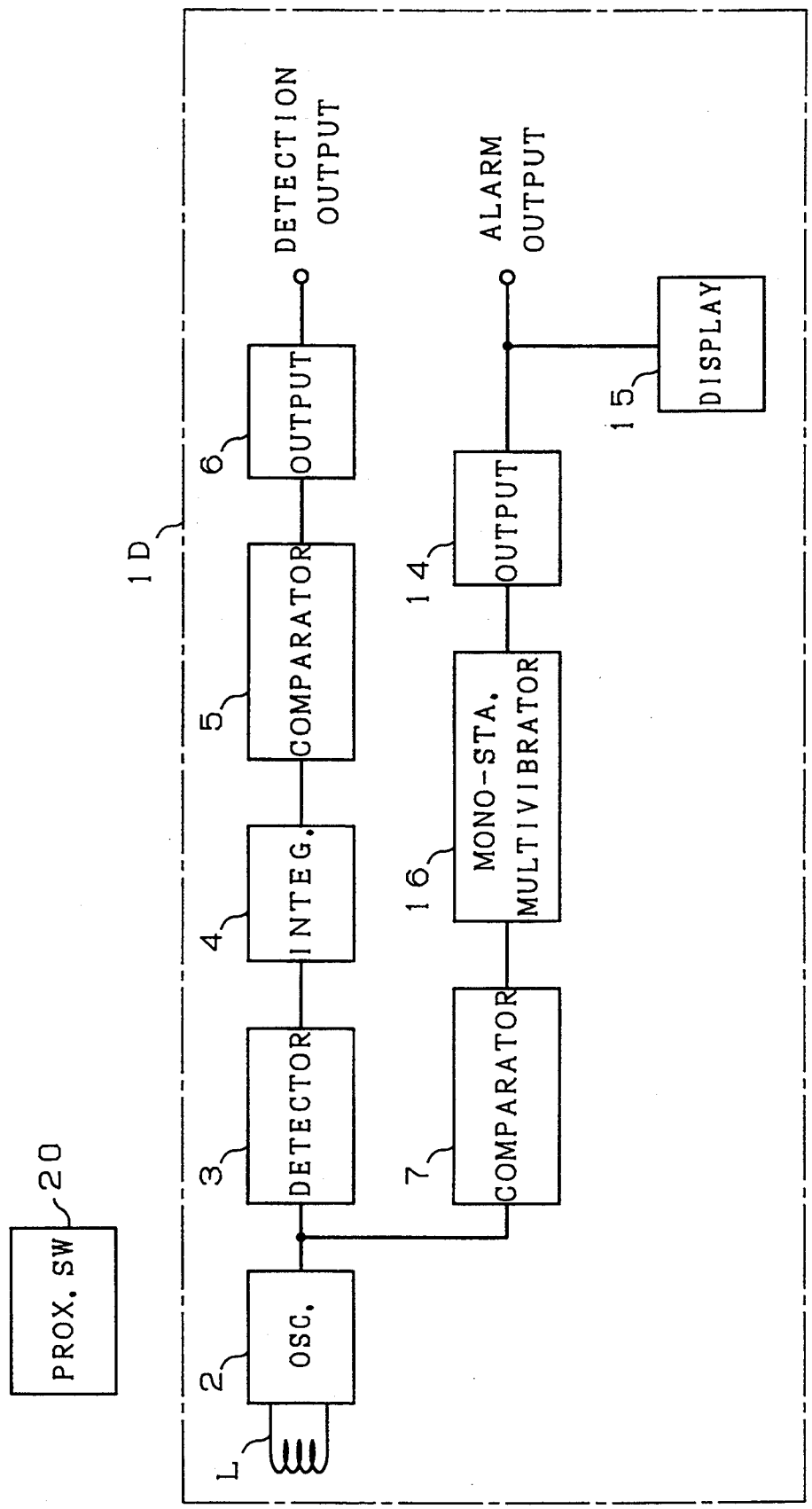
FIG. 6 is a schematic block diagram of a proximity switch of a third embodiment of this invention.

FIG. 6 shows a block diagram of a proximity switch 1D as a fourth embodiment of this invention. The components of this embodiment which are the same as those of the switch 1A of the first embodiment are referred to by the same referenced numerals. In this embodiment, output from comparator 7 is applied to a retriggerable mono-stable multivibrator (MM) 16. The multivibrator 16 starts to operate in response to output from comparator 7, and continues to output for application to output circuit 14 if it is continuously triggered within a predetermined time. The output circuit 14 externally generates an alarm signal about mutual interference to be displayed by display 15. If a mutual interference state exceeding the threshold value $V_{ref2}$ continues by comparator 7, the interference state is externally generated and displayed. Though the output circuit 14 externally generates and displays an alarm signal of a mutual interference state, the multivibrator 16 may be replaced with integrating circuit 8 and comparator 9 if desired.

It should be understood that the above description is merely illustrative of this invention and that many changes and modifications may be made by those skilled in the art without departing from the scope of the appended claims.

What is claimed is:

1. A proximity switch comprising:
   an oscillator;
   first comparison means for detecting a decrease in output level of said oscillator; and
   second comparison means for generating a signal when an output from said oscillator exceeds a predetermined value, wherein an alarm indicating mutual interference is generated in response to said signal from said second comparison means.

2. A proximity switch comprising:
   an oscillator;
   first comparison means for detecting a decrease in output level of said oscillator;
   second comparison means for generating an alarm representing a mutual interference when an output from said oscillator exceeds a threshold level which is higher than an output level when an object is out of range from said proximity switch; and
   frequency adjusting means for changing the oscillation frequency of said oscillator when a comparison output signal from said second comparison means is obtained.

3. A proximity switch comprising:
   an oscillator;
   first comparison means for detecting a decrease in output level of said oscillator;
   second comparison means for generating an alarm representing a mutual interference when an output from the oscillator exceeds a threshold level which is higher than an output level when an object is out of range from said proximity switch;
   display means for displaying an output of said second comparison means; and
   frequency adjusting means for changing the oscillation frequency of said oscillator.

4. A proximity switch as claimed in claims 1, 2 or 3, wherein said second comparison means comprises a first comparator for generating an output when an input applied to said first comparator exceeds a threshold value which is higher than an output level of said oscillator when an object to be sensed is out of range to be sensed;
   an integrating circuit for integrating said output of said first comparator; and
   a second comparator for discriminating the output of said integrating circuit by a third threshold value.

5. A proximity switch as claimed in claim 1, 2 or 3, wherein said second comparison means comprises a comparator for generating an output when an output of said oscillator exceeds a second threshold value, and a retriggerable mono-stable multivibrator to be triggered by said output of said comparator as a trigger signal thereof.

6. A proximity switch as claimed in claims 2 or 3, wherein said frequency adjusting means comprises a plurality of series connections, each of said series connections having a capacitor and a switching means which are connected in parallel with said oscillator, and
   a code converting circuit for switching each of said switching means in response to the output of said second comparison means.

7. A proximity switch as claimed in claims 2 or 3, wherein said frequency adjusting means comprises a plurality of series connections, each of said series connections having a capacitor and a switching means which are connected in parallel with said oscillator, and
   a code converting circuit having an oscillator to be actuated by the output of said second comparison means and a counter for counting the output of said oscillator to switch said switching means by parallel outputs from said counter.

8. A proximity switch as claimed in claims 2 or 3, wherein said frequency adjusting means comprises a voltaged controlled variable capacitance element connected in parallel with a resonance circuit of said oscillator, and
   voltage adjusting means for continuously changing a voltage applied to said voltaged controlled variable capacitance element by the output from said second comparison means.

* * * * *